March 12, 1968 G. K. GABLE ET AL 3,372,472

METHOD FOR FORMING A THERMOELECTRIC MODULE

Filed May 22, 1962

INVENTORS.
GERALD K. GABLE.
GEORGE D. HUDELSON.
BY Raymond Curtin
ATTORNEY.

United States Patent Office 3,372,472
Patented Mar. 12, 1968

3,372,472
METHOD FOR FORMING A THERMOELECTRIC MODULE

Gerald K. Gable, North Syracuse, and George D. Hudelson, Fayetteville, N.Y., assignors to Carrier Corporation, Syracuse, N.Y., a corporation of Delaware Filed May 22, 1962, Ser. No. 196,732
1 Claim. (Cl. 29—611)

Figure 2:
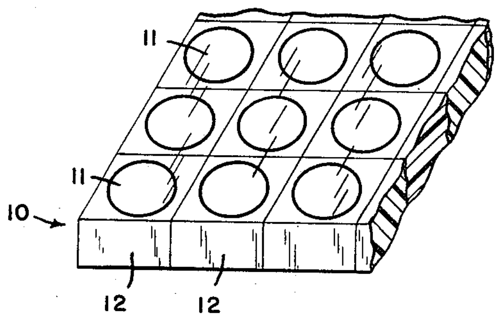

This invention relates to means implementing the construction of thermoelectric devices, more particularly to means for supporting a thermoelectric element so that it may be efficiently combined with other elements into a thermoelectric device.

With the development of thermoelectric technology, a variety of devices are being evolved utilizing Peltier or Seebeck principles to obtain either heat pumping or electrical generation, respectively. In accordance with Peltier principles, the passage of a direct current through the junction of two dissimilar metals results in the absorption of heat at one junction and the dissipation of heat at another. Seebeck principles note that the application of heat to one junction of dissimilar metal results in a flow of current between the hot junction and a cold junction in a circuit including these dissimilar metals. In attempting to construct any device embodying these teachings, problems arise in supporting the thermoelectric elements utilized, since it is necessary to make certain that desired electrical contact is obtained between the thermoelectric elements and the other circuit components, and since a large number of thermoelectric elements are generally required to obtain practical useful results it is desirable to be able to readily assemble the required number of elements. Additional problems arise in minimizing heat transfer between opposite ends of the thermoelectric elements.

It is with the above problems and desiderata in mind, that the present means including both method and apparatus have been evolved implementing the arrangement of thermoelectric elements in a structure suitable either for heat pumping or electrical generation. The novel means serve to provide a simple readily manipulatable module containing a thermoelectric element so that this module may be combined with like modules to form the desired thermoelectric device.

It is accordingly an object of this invention to provide a novel thermoelectric module.

Another object of this invention is to provide an improved method of supporting a thermoelectric element to implement its assembly with like elements into a thermoelectric device.

A further object of the invention is to provide means implementing the formation of desired electrical connections between thermoelectric elements in an electrical circuit.

A further object of the invention is to provide improved means for thermally and electrically insulating thermoelectric elements one from the other.

It is also an object of the invention to provide novel means minimizing heat transfer between the cold and hot junctions of a thermoelectric device.

A further object of the invention is to provide supporting means for a thermoelectric element in a thermoelectric device which strengthens the element.

An additional object of the invention is to provide means implementing assembly of a thermoelectric device by providing modules of precise dimensions.

These and other objects of the invention which will become hereafter apparent are achieved by employing a novel potting technique to form a rod of thermoelectric material within an insulating sleeve or casing. The sleeve or casing has a cross section providing at least one flat exterior surface so that it may readily be arranged adjacent similar flat surfaced elements. A rectilinear or triangular cross section is found suitable. Subsequent to the formation of the potted rod individual elements of desired length are cut from the rod. The material in which the rod is potted is an insulating material of any type having good adhesive character and structural strength such as an epoxy resin loaded with a low conductivity filler.

A feature of the invention resides in the precision with which the thermoelectric elements may be positioned with respect to each other so that desired manufacturing tolerances may be obtained.

Another feature of the invention resides in the fact that the solder drip encountered in conventional assembly of thermoelectric elements which often serves to short-circuit the element is eliminated.

A further feature of the invention resides in the fact that the insulating layer provides structural strength for the thermoelectric elements.

Figure 1:
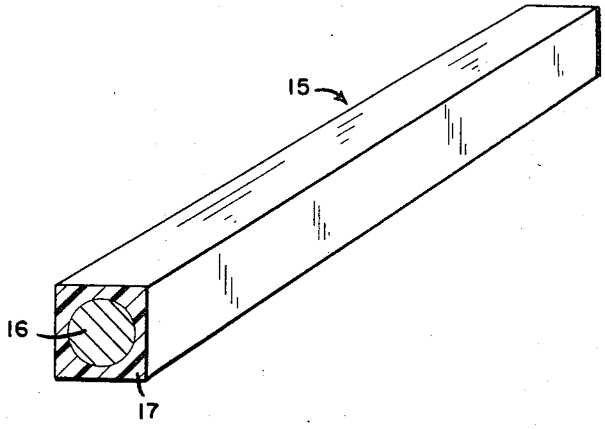

The specific details of the invention, and their mode of functioning will be made most manifest and particularly pointed out in clear, concise and exact terms in conjunction with the accompanying drawings, wherein:

FIGURE 1 is a perspective view of a rod of thermoelectric material potted in accordance with the teachings of the invention; and FIGURE 2 is a perspective detail view of a panel of a thermoelectric device showing how the modules are arranged with respect to each other.

Referring now more particularly to the drawings, like numerals in the various figures will be employed to designate like parts. As seen in FIGURE 2, the module 10 is formed with a thermoelectric element 11 arranged securely within an insulating casing block 12 of rectilinear cross section. Though a rectilinear cross section (in this case a square) is shown, it will be understood from the following that any cross section providing a flat exterior surface may be employed. Thus the insulating casing block 12 may have a square, triangular, semicircular, or any flat sided cross section.

Module 10 is formed from bar 15 as best seen in FIGURE 1. Bar 15 comprises a rod 16 of thermoelectric material encased within an adhesive type insulating casing or sleeve 17.

From the bar 15 desired lengths are cut to form the module 10. A plurality of these modules 10 may then be combined into the panel, a part of which is shown in FIGURE 2.

The thermoelectric material though illustrated as of circular cross section, may be of any other satisfactory readily fabricated cross section. Conventional thermoelectric materials such as zone leveled bismuth telluride or the like may be employed. The insulating casing material may be of any suitable type having high electrical and thermal insulating properties, with desired strength and adhering to the surface of the thermoelectric material. An epoxy resin such as Hysol 2039 sold by Hysol Corporation loaded with nitrogen filled microballoons has been found particularly suitable in forming the casing.

The aforedescribed module structure is formed from a rod of thermoelectric material such as lead telluride or the like of a cross section providing desired thermoelectric properties. It will be apparent to those skilled in the art that the dimensioning of the thermoelectric material is a function of the design consideration of the particular device in which the thermoelectric material is to be employed.

This rod or length of thermoelectric material is encased or potted in the desired adhesive type insulating material such as Hysol 2039 which provides desired thermal and electrical insulation for the thermoelectric material, and has sufficient adhesive quality so that a secure bond will be formed between the insulating materila and the thermoelectric material. The cross section of the thermoelectric material is preferably of a circular configuration, but may in given instances be formed in a variety of other cross sections, the primary consideration being that the cross section of the potted thermoelectric material may readily mate with like potted thermoelectric materials to form a mass of contiguous modules in a thermoelectric device. Thus a triangular cross section or a semicircular cross section may prove desirable. Additionally, it is contemplated within the scope of this invention to utilize mating curvilinear surfaces such as sinusoids or the like, as may prove convenient.

In use, the potted rod of thermoelectric material is cut into sections so as to provide lengths of potted thermoelectric elements which form the modules of the thermoelectric device. The thermoelectric properties of the module will be a function of the material of the thermoelectric element, and the dimensions thereof. It is preferred that each module be of the same dimension, even though the thermoelectric element of the module may be of different dimensions so long as the end surface of the module reveals an exposed thermoelectric surface for connection to a junction.

The modules are arranged with respect to each other over a surface such as a flat plate or the like on which appropriate junction straps have been positioned. Thereafter the modules are arranged over the junction straps and plate so as to provide the desired arrangement of thermoelectric elements. In designing the device, the dimension of each module will be such that by positioning of the modules adjacent each other with surfaces contiguous, proper thermoelectric element orientation will be attained.

It is thus seen that the novel potted thermoelectric element provides a module or building block which may readily be assembled with like modules to form a thermoelectric device in which the strength of the thermoelectric element is increased, electrical insulation is obtained between the junction straps, and thermal insulation between the hot and cold junctions results, in a simple efficient fashion.

The above disclosure has been given by way of illustration and elucidation, and not by way of limitation, and it is desired to protect all embodiments of the herein disclosed inventive concept within the scope of the appended claim.

We claim:

1. A method for forming a thermoelectric module, said method comprising the steps of: encasing an elongate rod of thermoelectric material in an insulating material; bonding the insulating material to the surface of the rod of thermoelectric material; forming the exterior surface of the insulating material with flat surfaces; and severing desired lengths of the encased rod to provide thermoelectric modules of desired dimensions for assembly into a thermoelectric device.

References Cited

UNITED STATES PATENTS

| | | | |
|---|---|---|---|
| 2,789,926 | 4/1957 | Finholt et al. | 117—232 X |
| 2,980,746 | 4/1961 | Claydon | 136—203 |
| 3,057,940 | 10/1962 | Fritts | 136—233 X |
| 2,906,801 | 9/1956 | Fritts | 136—224 |
| 2,665,322 | 1/1954 | MacDonald | 136—201 X |
| 2,997,776 | 8/1961 | Matter et al. | 117—21 |

FOREIGN PATENTS 760,563 10/1956 Great Britain.

OTHER REFERENCES

Skeist, I.: "Epoxy Resins (Reinhold Plastics Applications Series)," Chapter 9: Electrical Embedments, Reinhold Pub. Corp. N.Y. 1958, pages 159–179.

ALLEN B. CURTIS, *Primary Examiner.*

JOHN H. MACK, WINSTON A. DOUGLAS, *Examiners.*

A. M. BEKELMAN, *Assistant Examiner.*